United States Patent
Samaras et al.

[11] Patent Number: 6,166,908
[45] Date of Patent: Dec. 26, 2000

[54] INTEGRATED CIRCUIT CARTRIDGE

[75] Inventors: Bill Samaras, San Jose; Michael Brownell, Los Gatos; Dan R. McCutchan, Redwood City, all of Calif.; Hong Xie, Phoenix, Ariz.

[73] Assignee: Intel Corporation, Santa Clara, Calif.

[21] Appl. No.: 09/409,752

[22] Filed: Oct. 1, 1999

[51] Int. Cl.[7] .................................................. H05K 7/20
[52] U.S. Cl. .......................... 361/700; 361/687; 361/707; 361/715; 361/818; 165/80.4; 165/104.33; 174/15.2
[58] Field of Search .................. 361/688–690, 361/694–700, 704, 707, 715, 718, 719–721, 818; 257/706, 707, 717, 712–722; 174/15.1, 15.2, 16.3; 165/80.2, 80.3, 80.4, 185

[56] References Cited

U.S. PATENT DOCUMENTS

| | | | |
|---|---|---|---|
| 4,165,607 | 8/1979 | Fedorowicz et al. | 58/50 R |
| 4,679,118 | 7/1987 | Johnson et al. | 361/386 |
| 4,853,762 | 8/1989 | Ewer et al. | 357/79 |
| 4,916,523 | 4/1990 | Sokolovsky et al. | 174/52.1 |
| 5,073,116 | 12/1991 | Beck, Jr. et al. | 439/71 |
| 5,097,387 | 3/1992 | Griffith | 361/699 |
| 5,163,551 | 11/1992 | Bhatia | 206/334 |
| 5,282,111 | 1/1994 | Hopfer | 361/704 |
| 5,329,426 | 7/1994 | Villani | 361/719 |
| 5,331,510 | 7/1994 | Ouchi et al. | 361/702 |
| 5,357,404 | 10/1994 | Bright et al. | 361/818 |
| 5,602,719 | 2/1997 | Kinion | 361/704 |
| 5,621,615 | 4/1997 | Dawson et al. | 361/704 |
| 5,642,262 | 6/1997 | Terrill et al. | 361/783 |
| 5,699,227 | 12/1997 | Kolman et al. | 361/700 |
| 5,801,929 | 9/1998 | Cheng | 361/807 |
| 5,802,707 | 9/1998 | Brownell et al. | 29/740 |
| 5,864,478 | 1/1999 | McCutchan et al. | 363/147 |
| 5,875,095 | 2/1999 | Webb | 361/700 |
| 5,880,524 | 3/1999 | Xie | 257/704 |
| 5,903,436 | 5/1999 | Brownell et al. | 361/704 |
| 5,949,647 | 9/1999 | Kolman et al. | 361/700 |
| 5,949,648 | 9/1999 | Liao | 361/700 |
| 5,982,635 | 10/1999 | Menzies et al. | 361/790 |
| 5,990,549 | 11/1999 | Chiu et al. | 257/706 |
| 6,021,044 | 2/2000 | Neville, Jr. et al. | 361/700 |
| 6,046,905 | 4/2000 | Nelson et al. | 361/704 |
| 6,058,013 | 5/2000 | Christopher et al. | 361/704 |
| 6,065,530 | 5/2000 | Austin et al. | 165/80.3 |

FOREIGN PATENT DOCUMENTS

| | | | |
|---|---|---|---|
| 7-113840 | 5/1995 | Japan | G01R 31/26 |

*Primary Examiner*—Leo P. Picard
*Assistant Examiner*—Boris L. Chervinsky
*Attorney, Agent, or Firm*—Schwegman, Lundberg, Woessner & Kluth, P.A.

[57] ABSTRACT

An integrated circuit cartridge has been described. The cartridge includes a heat pipe lid that comes in thermal contact with at least one integrated circuit die. The integrated circuit die is mounted on a substrate that is held in a cavity of a pin chassis that has a grid array of pins for interconnection with a socket. The integrated circuit die can be mounted on a secondary substrate that is mounted to a primary substrate. The substrate has an edge connector to supply power to the integrated circuit die, freeing the grid array of pins to be used for signal interconnects. The substrate has a grid of connections soldered to the grid array of pins on the pin chassis. The pin chassis also supplies key structures that aid in alignment of the pins and a socket.

26 Claims, 10 Drawing Sheets

INTEGRATED CIRCUIT CARTRIDGE

FIELD

The present invention relates generally to computer board and chip packaging, and more specifically to chip package design and manufacturing.

BACKGROUND

Semiconductor technology continues to advance at a rapid rate. Advancements include increases in semiconductor die density which allows for ever-increasing amounts of circuitry in any given die size, and also include increases in speeds at which semiconductor circuits operate. Higher semiconductor die densities and increased semiconductor circuit speeds combine to increase the computational speed in computers and other electronic devices.

Along with increased density and speed of semiconductor devices comes increased power consumption. State-of-the-art semiconductor circuits can consume considerable amounts of power, much of which gets dissipated as heat. The problem of increased heat dissipation is compounded by the fact that as semiconductor dice shrink, the amount of heat to be dissipated per unit area of semiconductor die increases.

Integration densities are increasing at the module level as well as at the die level. As modules hold increasing numbers of semiconductor dice, packaging solutions capable of interconnecting the dice and efficiently dissipating heat become increasingly difficult.

For the reasons stated above, and for other reasons stated below which will become apparent to those skilled in the art upon reading and understanding the present specification, there is a need in the art for a semiconductor packaging solution capable of efficiently dissipating heat.

SUMMARY

In one embodiment, a cartridge includes a pin chassis having a bottom side and a top side, the bottom side having a plurality of pins protruding therefrom, and the top side having a cavity therein. The cartridge further includes at least one assembly including an integrated circuit die, the at least one assembly being disposed within the cavity and being electrically coupled to the plurality of pins.

In another embodiment, a cartridge includes a heat pipe lid, an assembly having at least one integrated circuit die thermally coupled to the heat pipe lid, and a pin chassis having a plurality of pins floatingly held therein, the plurality of pins being electrically coupled to the assembly.

In another embodiment, a processing system includes a motherboard configured to receive a plurality of circuits, and a packaged integrated circuit coupled to the motherboard. The packaged integrated circuit of this embodiment includes a pin chassis having a plurality of pins protruding from a bottom side thereof, and having a top side with a cavity therein, and an integrated circuit die disposed in the cavity. The packaged integrated circuit further includes a layer of thermally conductive material disposed on the integrated circuit die, and a heat pipe disposed on the layer of thermally conductive material, a thickness of the thermally conductive material forming a bondline thickness.

DESCRIPTION OF EMBODIMENTS

In the following detailed description of the embodiments, reference is made to the accompanying drawings which show by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

Figure 1:
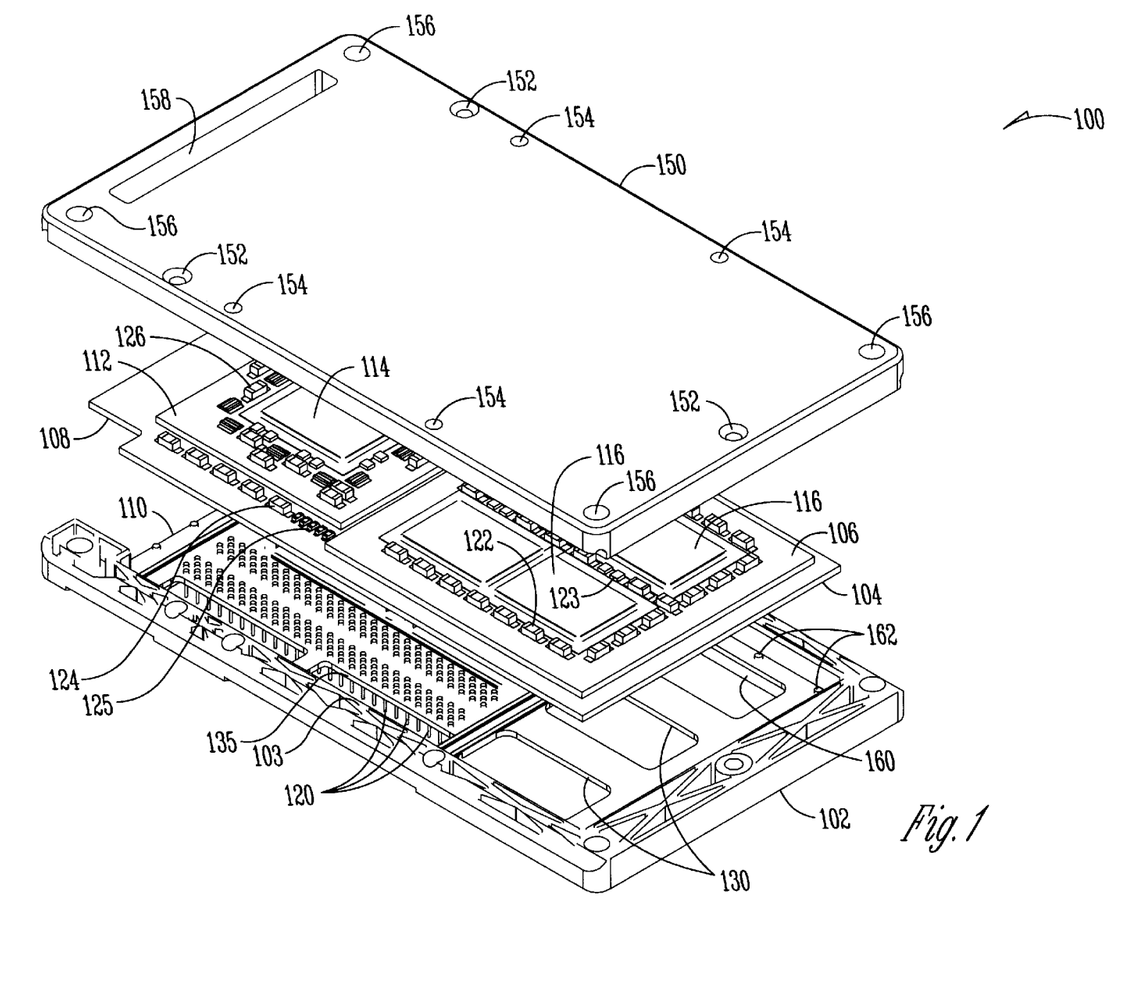
FIG. 1 is an exploded isometric view of a cartridge according to one embodiment of the present invention.

FIG. 1 shows an exploded isometric view of a cartridge according to one embodiment of the present invention. Cartridge 100 includes pin chassis 102, substrate assembly 104, and heat pipe lid 150.

Substrate assembly 104 includes integrated circuit dice 114 and 116. Integrated circuit die 116 is mounted on interposer 106, which is in turn mounted to substrate assembly 104. Integrated circuit die 114 is also mounted to a substrate 112 which is in turn mounted to substrate assembly 104. Substrate 112 can be any type of substrate capable of accepting integrated circuit die 114. In some embodiments, substrate 112 is an organic land grid array (OLGA). Passive devices, such as capacitors, inductors, and resistors, can be mounted in various locations on substrate assembly 104. For example, capacitors 126 are shown mounted on substrate 112, capacitors 122 and inductors 123 are shown mounted on interposer 106, and capacitors 124 and resistors 125 are shown mounted directly to substrate assembly 104. One skilled in the art will appreciate that any type of passive component can be mounted to any of the substrates without departing from the scope of the present invention.

In some embodiments, integrated circuit dice such as dice 114 and 116 are mounted directly to substrate assembly 104 without first being mounted to substrate 112 and interposer 106. In other embodiments, dice 116 are mounted on an interposer, and die 114 is mounted directly to substrate assembly 104. Many of these embodiments, and variations thereof, are shown in the following figures and described with reference thereto.

In the embodiment shown in FIG. 1, integrated circuit die 114 is mounted to an OLGA that is mounted to primary substrate 201 such that the electrical connections are aligned directly over pin locations. This enables the shortest electrical path from the OLGA through primary substrate 201 to the pins. By mounting integrated circuit die 114 such that electrical paths are substantially vertical and parallel, electrical stub lengths of the signal traces are kept short and substantially uniform. This aids in high speed operation.

Substrate assembly 104 also includes edge connector 108. In some embodiments, edge connector 108 is configured to receive power for integrated circuit die mounted thereon. In other embodiments, edge connector 108 is used for both power connections and signal connections. When edge connector 108 has a portion dedicated as a power connector, a low inductance power connection can be made that is capable of carrying a large current.

Pin chassis 102 has a bottom side with pins 120 protruding therefrom, and a top side with a cavity therein. The cavity is formed by a recess partially surrounded by pin chassis wall 103 around the perimeter of pin chassis 102. In some embodiments, when substrate assembly 104 is mated with pin chassis 102, substrate assembly 104 is housed completely within the cavity, thereby providing protection to substrate assembly 104 and components mounted thereon.

Pin chassis 102 "floatingly" holds the array of pins 120 by providing a minimum clearance between the pins and the holes in which they are situated, such that the pins can freely move about. Each of pins 120 has a small detent feature that allows the pin to snap into pin chassis 102 and "float" until it is soldered to an interconnect on the bottom side of substrate assembly 104. By allowing the pins to float within a small tolerance, the pins align to the substrate assembly when soldering, and manufacturability can be increased. Shroud 160 also protrudes from the bottom of pin chassis 102. Shroud 160 protrudes from pin chassis 102 further than pins 120. This provides protection for pins 120 during manufacturing and subsequent handling. Shroud 160 also includes key structures described more fully with reference to FIGS. 3B and 3C below.

Pin chassis 102 also includes support stands 162 protruding from the floor of the cavity near pin chassis wall 103. Support stands 162 provide a mounting structure for substrate assembly 104. When substrate assembly 104 is combined with pin chassis 102, interconnects on the bottom of substrate assembly 104 are soldered to pins 120, and support stands 162 provide support around the perimeter of substrate assembly 104.

Pin chassis 102 also includes recess 110. Recess 110 is a recess in pin chassis wall 103 that allows access to edge connector 108 on substrate assembly 104. Edge connector 108 protrudes out into recess 110 when cartridge 100 is assembled, thereby providing a power connection for substrate assembly 104 other than through pins 120. Pin chassis 102 also includes a number of apertures therethrough. Examples include apertures 130 and apertures 135. Apertures 130 and 135 allow access to the bottom of substrate assembly 104 after the cartridge is assembled. Access to the bottom of substrate assembly 104 can be useful for operations such as adding components to an assembled cartridge, providing additional power connections, testing the assembled cartridge, or the like.

Heat pipe lid 150 is a heat pipe which includes an internal vapor chamber, wicking structure, and working fluid, that combine to efficiently transfer and spread heat. Heat pipes of this sort are typically used to transfer heat from one location to another; one example being a notebook computer where heat pipes can be used to transfer heat from a location buried within the computer to a corner of the computer where a fan exists. In the embodiment of FIG. 1, heat pipe lid 150 efficiently spreads heat across the face of heat pipe lid 150 such that the heat can be dissipated efficiently. When heat pipe lid 150 is functioning efficiently, the temperature gradient is very low across the surface of heat pipe lid 150. For example, in one embodiment, the surface portion over the internal vapor chamber of heat pipe lid 150 exhibits less than a 10 degree Celsius gradient between the hottest and coolest points.

Heat pipe lid 150 is thermally coupled to integrated circuit dice 114 and 116 when cartridge 100 is assembled. Heat pipe lid 150 has platens (not shown in FIG. 1) that extend partially into the cavity of pin chassis 102. The platens are in thermal contact with integrated circuit dice 114 and 116. A "bondline" is formed at the junction where the platens meet the dice. The bondline has a bondline thickness that can be maintained in different ways, as is explained more fully below with reference to the remaining figures.

Heat pipe lid 150 includes fastening points 152, 154, and 156. In some embodiments, fastening points 152 are holes for receiving fasteners that hold cartridge 100 together, fastening points 154 are points at which a heat sink is attached to heat pipe lid 150, and fastening points 156 are holes that receive posts from a retention mechanism mounted to a system that receives the assembled cartridge. Heat pipe lid 150 also includes aperture 158 that allows access to edge connector 108 of substrate assembly 104.

Various embodiments of substrate assemblies, pin chassis, and heat pipe lids are described with reference to the remaining figures. One skilled in the art will understand that the different embodiments of each can be combined in different ways providing a large number of embodiments of assembled cartridges.

Substrate Assembly

Figure 2A:
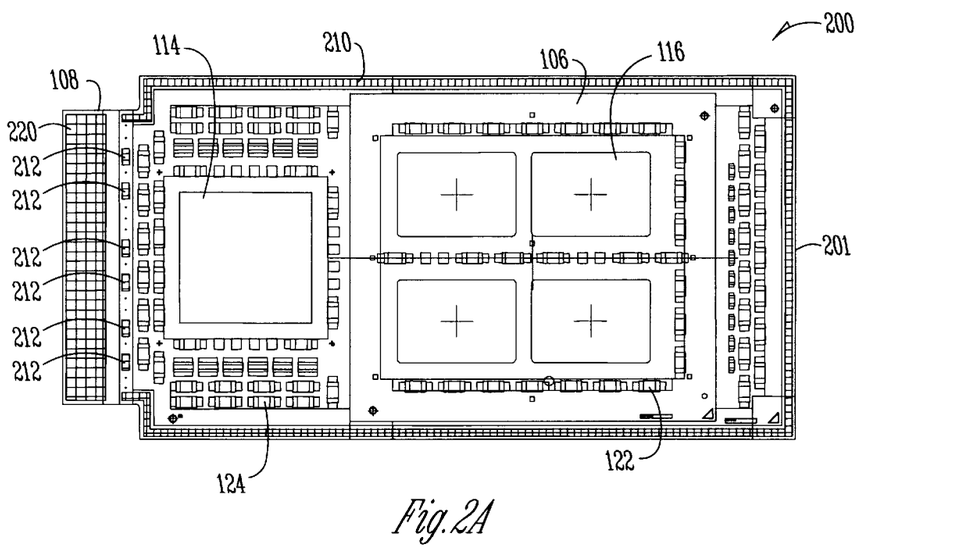
FIGS. 2A–2C show a top view, a side view, and a bottom view of a substrate assembly.

FIG. 2A shows a top view of a substrate assembly. Substrate assembly 200 is one embodiment of a substrate assembly that can be utilized in cartridge 100 (FIG. 1). Substrate assembly 200 includes primary substrate 201. Primary substrate 201 is a printed circuit board that physically and electrically couples integrated circuit dice to pins which can be received by a socket. The pins are those shown in FIG. 1 as part of pin chassis 102. The integrated circuit dice are those mounted on the top side of substrate assembly 200 such as integrated circuit dice 114 and 116.

Substrate assembly 200 includes integrated circuit die 114, and integrated circuit dice 116. In the embodiment shown in FIG. 2A, integrated circuit dice 11 6 are mounted on interposer 106, which is in turn mounted to primary substrate 201, and integrated circuit die 114 is mounted directly to primary substrate 201. Integrated circuit dice 114 and 116 are "flip chip" mounted such that electrical connections are made at the junction between the integrated circuit die and the board to which is mounted. The exposed portions of integrated circuit dice 114 and 116 are thermally conductive surfaces that are useful for heat transfer.

As shown in FIG. 2A, interposer 106 includes four integrated circuit dice 116. In this embodiment, interposer 106 forms a substrate for a multichip module (MCM). In some embodiments, less than or more than four integrated circuit dice 116 are mounted on interposer 106. In other embodiments, integrated circuit dice 116 are not mounted on interposer 106, but rather are mounted directly to primary substrate 201.

Also as shown in FIG. 2A, integrated circuit die 114 is flip chip mounted directly to primary substrate 201. In some embodiments, integrated circuit die 114 is mounted to a secondary substrate, which is in turn mounted to primary substrate 201. One skilled in the art will appreciate that any number of integrated circuit dice can be mounted directly to primary substrate 201, and any number of integrated circuit dice can be mounted to a secondary substrate, such as interposer 106, which is then mounted to primary substrate 201. Secondary substrates can be any type of substrate capable of accepting an integrated circuit die. For example, secondary substrates can be integrated circuit boards, land grid array (LGA) substrates, substrates used in multichip modules, or the like.

Integrated circuit dice and secondary substrates are attached to primary substrate 201 using a grid of connections. In some embodiments, the grid of connections takes the form of a grid of pads capable of receiving a Land Grid Array (LGA) or Ball Grid Array (BGA) substrate. In other embodiments, the grid of connections is capable of receiving a flip chip mounted integrated circuit.

In some embodiments, integrated circuit dice mounted on substrate assembly 200 include microprocessors, memory devices, and memory controllers. The memory devices and controllers can be mounted to a secondary substrate, such as interposer 106. In the embodiment shown in FIG. 2A, interposer 106 holds four memory dice, shown as integrated circuit dice 116, and substrate 201 has a microprocessor mounted directly thereon, shown as integrated circuit die 114. Mounting integrated circuit dice 116 on interposer 106 prior to mounting interposer 106 on primary substrate 201 allows for modular assembly and testing. For example, a multichip module built on interposer 106 can be assembled in a first operation, tested in a second operation, and mounted to primary substrate 201 in a third operation.

As shown in FIG. 2A, substrate assembly 200 also accommodates multiple passive devices, such as capacitors, inductors, and resistors. Passive components 122 are mounted to interposer 106. Passive components 124 are mounted directly to primary substrate 201. In some embodiments, active components are also included mounted directly to primary substrate 201. In other embodiments, passive and active components are also mounted to the bottom side of substrate assembly 200.

Substrate assembly 200 also includes edge connector 108. Edge connector 108 can couple electrical signals to and from substrate assembly 200, and can also be used to supply power to circuitry mounted on substrate assembly 200. When power is brought to substrate assembly 200 using edge connector 108, pins 120 on pin chassis 102 (FIG. 1) are available to carry signals since they are not used to transfer power. In high-power applications, such as those that dissipate significant amounts of heat, edge connector 108 can devote significant surface area to supply adequate current with low impedance. For example, power connections 220 on the edge connector 108 can dedicate significant surface area for use as a power connector, thereby providing a low impedance power connection. In addition, by using opposing surfaces of the primary substrate for power distribution, very low electrical inductance can be achieved in the power distribution paths.

Primary substrate 201 includes a ring of conductive material around the edge, called an "EMI control ring." The electromagnetic interference (EMI) control ring is outside of the interposer and other integrated circuit dice. When assembled, a rim of the heat pipe lid comes in contact with the EMI control ring on primary substrate 101 about the edge of primary substrate 101. The EMI control ring can be a "stitch ring" generated with multiple vias stitched together through primary substrate 201 with conductive material. The EMI control ring and the rim on the heat pipe lid provide an EMI shield. One skilled in the art will understand that the amount of EMI protection provided is controlled in part by the distance between stitch vias.

In the embodiment shown in FIG. 2A, EMI control ring 210 runs continuously about the perimeter of primary substrate 201 with the exception of an area near edge connector 108. In this embodiment, EMI control ring 210 is not continuous near edge connector 108, but rather is intermittent as shown by stitch ring segments 212. Stitch ring segments 212 are used in lieu of a continuous stitch ring to allow for greater area to be used for transferring power from edge connector 108 into substrate assembly 200. In some embodiments, EMI control ring 210 is continuous around the entire perimeter of surface layers or buried layers of primary substrate 201. In still other embodiments, EMI control ring 210 is intermittent around the entire perimeter of primary substrate 201.

In some embodiments, primary substrate 201 is a multi-layer printed circuit board. Within the multi-layer printed circuit board, some layers are used for signal interconnects, and some layers are used for power distribution. In some embodiments, when primary substrate 201 includes multiple layers, some layers have a continuous EMI control ring, and some layers have an intermittent control ring as shown by stitch ring segments 212. The EMI control ring can be continuous on signal layers, and intermittent on power distribution layers, or can be continuous on only some signal layers or power distribution layers. On power distribution layers that do not have a continuous stitch ring, vias used in the stitch ring poke through the power distribution layer, but space is left between the vias for power distribution.

Figure 2B:
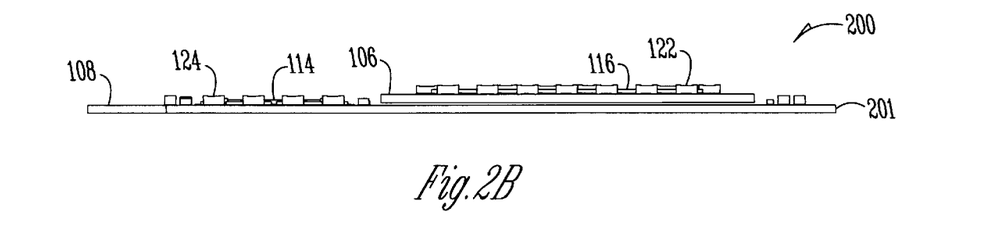

FIG. 2B shows a side view of a substrate assembly. Substrate assembly 200, as shown in FIG. 2B includes interposer 106 having integrated circuit dice 116 mounted thereon. Interposer 106 and integrated circuit die 114 are mounted to primary substrate 201. Passive components 122 and 124 are also shown. The relative heights above the primary substrate 201 of integrated circuit dice 114 and 116 are parameters used when designing a heat pipe lid for efficient heat transfer away from the integrated circuit dice. The heat pipe lid, and the effect of differing heights of integrated circuit dice on the design of the heat pipe lid are discussed in more detail below.

Figure 2C:
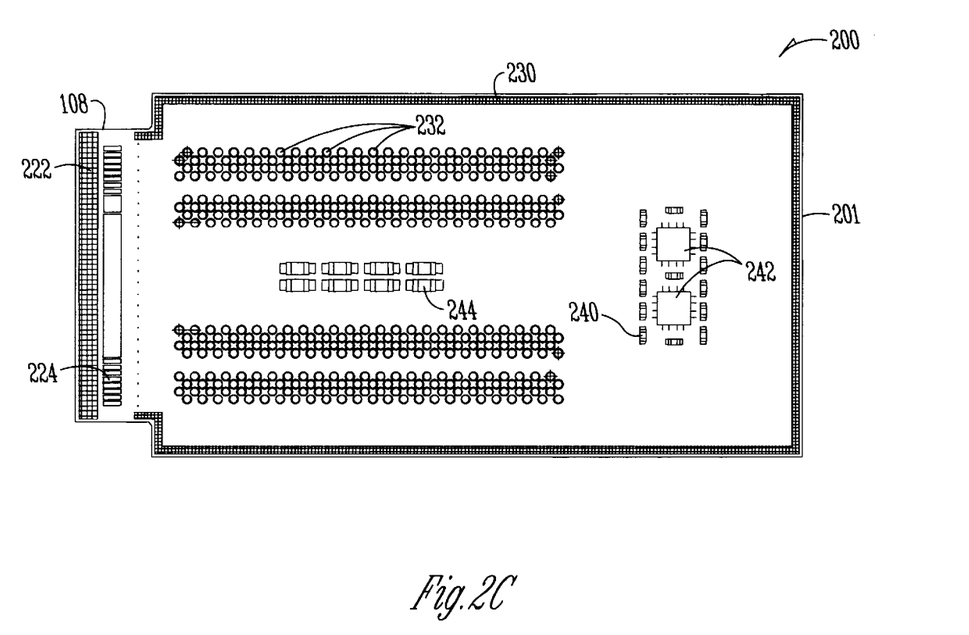

FIG. 2C shows a bottom view of a substrate assembly. The bottom view of substrate assembly 200 shows primary substrate 201 having EMI control ring 230, signal interconnects 232, and edge connector 108. Substrate assembly 200 also includes active components 242 and passive components 240 and 244. In some embodiments, only passive components are on the bottom side of substrate assembly 200, and in other embodiments, only active components are on the bottom side of substrate assembly 200.

In the embodiment of FIG. 2C, edge connector 108 includes power connections 222 and signal interconnects 224. In this embodiment, edge connector 108 is used for the connection of power and signals. In other embodiments, edge connector 108 is used only for power connections. Signal interconnects 232 are arranged in a grid fashion such that they mate with pins 120 (FIG. 1). When substrate assembly 200 is assembled into pin chassis 102, pins 120 are soldered to signal interconnects 232. Prior to pins 120 being soldered to signal interconnects 232, pins 120 are held floatingly within pin chassis 102. After pins 120 are soldered to signal interconnects 232, pins 120 are held more rigidly with respect to pin chassis 102.

In the embodiment of FIGS. 2A–2C, integrated circuit die 114 is positioned above pins 120, and integrated circuit dice 116 are not. Integrated circuit die 114 has some signal connections to pins 120 and some signal connections to integrated circuit die 114. In some embodiments, signal interconnections from integrated circuit die 114 that connect to pins 120 are arranged such that substantially vertical and parallel signal paths are maintained. For example, pins 120 can be assigned to signals that emanate from integrated circuit die 114 directly above. By assigning pins to signals in this fashion, critical signals traversing substrate assembly 200 (FIG. 2B) and pin chassis 102 (FIG. 1) can have very short lengths, thereby improving the electrical characteristics of the signal interconnections between integrated circuit die 114 and pins 120.

Pin Chassis

Figure 3A:
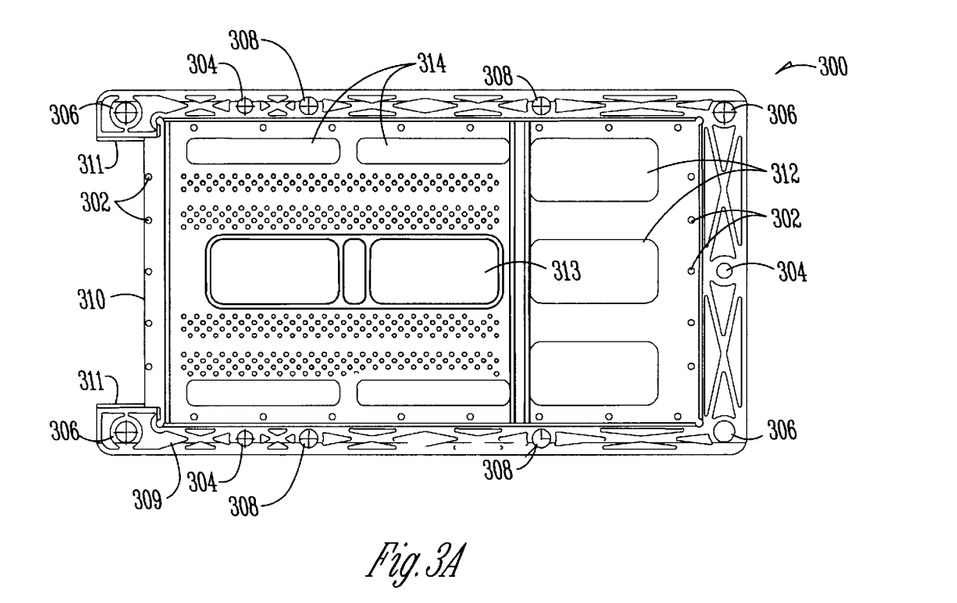
FIGS. 3A–3C show a top view, a bottom view, and a cross-section of a pin chassis.

FIG. 3A shows a top view of a pin chassis. Pin chassis 300 can be a pin chassis such as pin chassis 102 (FIG. 1). The top view shown in FIG. 3A is a view looking down into the cavity of pin chassis 300 where a substrate assembly resides in an assembled cartridge, such as cartridge 100 (FIG. 1). Pin chassis 300 includes fastening points 304, 306, and 308. In the embodiment shown in FIG. 3A, fastening points 304 are used to fasten the assembled cartridge together, and fastening points 308 are used to fasten a heat sink to the assembled cartridge.

In some embodiments, fastening points 308 are clearance holes that allow heat sink attaching fasteners (not shown) to pass through and contact the heat pipe lid. In these embodiments, pin chassis 300 is fastened to the heat pipe lid, and the heat pipe lid is fastened to the heat sink. In other embodiments, fastening points 308 are not clearance holes, but are holes that allow only portions of fasteners to pass through. In these embodiments, when the heat sink fasteners are in place, the heat sink fasteners hold the heat sink in place, and also hold pin chassis 300 to the heat pipe lid.

Any of the fastening points can have threaded inserts pressed therein for fastening purposes. For example, when fastening points 304 function as heat pipe lid fastening points with threaded inserts, the heat pipe lid can be attached to pin chassis 300 using threaded fasteners such as screws, and as a result, the heat pipe lid is held in thermal contact with integrated circuit dice within the cavity.

Fastening points 306 are configured to receive posts from a retention mechanism mounted on a larger substrate, such as a motherboard, that receives an assembled cartridge. Pin chassis 300 also includes apertures 312, 313, and 314. These apertures reduce the weight of pin chassis 300, and also provide access to the underside of a substrate assembly after the cartridge is assembled. Further, apertures 312, 313, and 314 improve manufacturability and inspectability of solder joints and enable the use of tall active and passive components on the bottom side of the primary substrate. Manufacturability is improved in part because heat can more readily flow during soldering.

In some embodiments, pin chassis 300 also includes support stands 302 that protrude from the floor of the cavity about the perimeter of the cavity near chassis wall 309. Support stands 302 function to provide support for a substrate assembly that is held within the cavity of pin chassis 300. Support stands 302 are positioned beneath the primary substrate. When the primary substrate is coupled to pin chassis 300, the primary substrate can rest on support stands 302, or can be pressed against support stands 302. When a heat pipe lid is attached, the primary substrate is sandwiched between a rim of the heat pipe lid and support stands 302.

Pin chassis 300 also includes recess 310. Recess 310 is an area about the perimeter of pin chassis 300 where pin chassis wall 309 is partially or completely recessed, such that edge connector 108 of substrate assembly 200 (FIG. 2) can rest outside the cavity formed by chassis wall 309. Rail 311 is a feature on chassis wall 309 that protrudes into recess 310. Rail 311 serves to guide a connector that mates with edge connector 108, and also serves to limit the deflection that the mating connector can impart on substrate assembly 200.

Figure 3B:
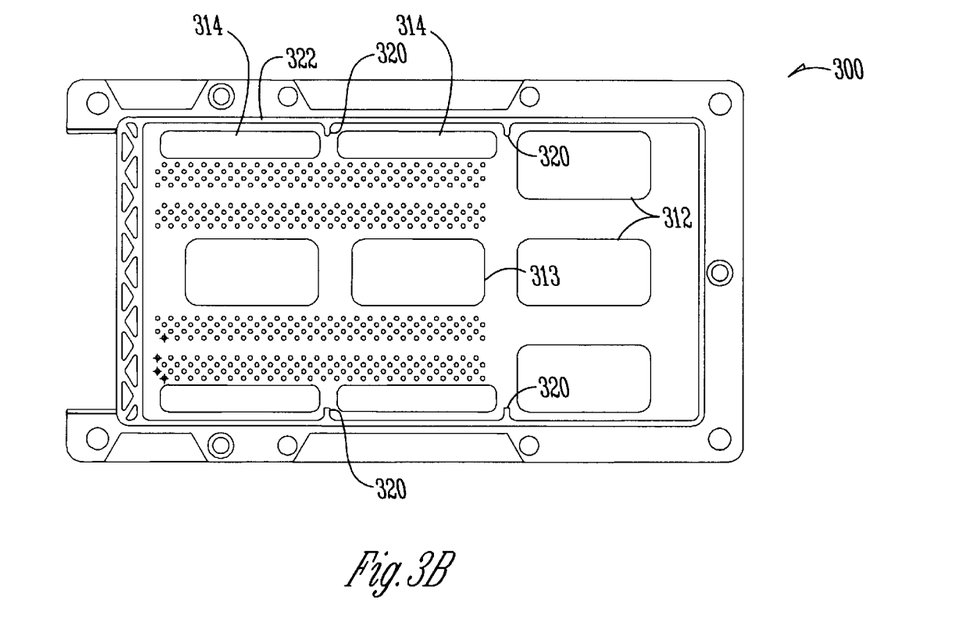

FIG. 3B shows a bottom view of a pin chassis. The bottom view of pin chassis 300 shows shroud 322, which corresponds to shroud 160 (FIG. 1). Shroud 322 includes key structures 320. Shroud 322 forms a small wall that partially or completely circumscribes the area about pins 120 where the pins protrude from pin chassis 300. Shroud 322 serves multiple purposes, including protecting pins 120 from mishandling. For example, if an assembled cartridge is set on a flat surface, shroud 322 contacts the flat surface and pins 120 do not. Weight can be applied to the assembled cartridge, and the weight will be transferred through shroud 322 to the flat surface, thereby protecting pins 120 from damage.

Shroud 322 also serves as a pilot mechanism when inserting an assembled cartridge in a socket. For example, when an assembled cartridge nears a socket to be mated therewith, shroud 322 makes contact with a feature on the socket and aligns pins 120 with pin receptacles in the socket prior to the pins making contact with the socket. Shroud 322 also has key structures 320 protruding towards the center of the cartridge. Key structures 320 also aid in the pilot mechanism function of shroud 322.

Figure 3C:
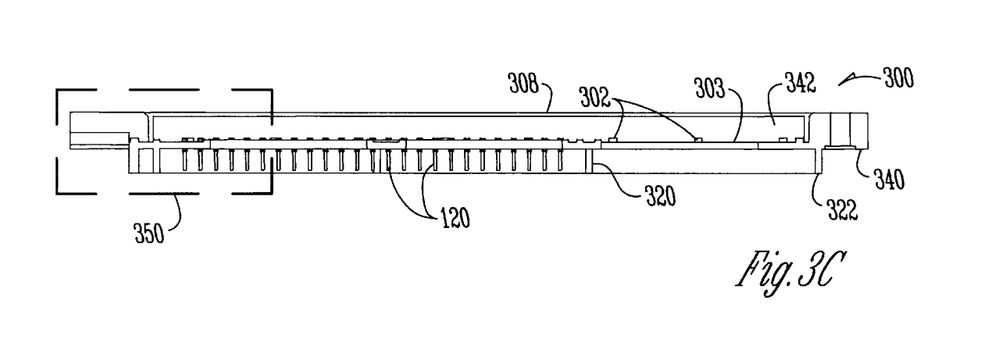

FIG. 3C shows a cross-section of a pin chassis. The cross-section of FIG. 3C shows pins 120 protruding from the bottom of pin chassis 300. Also shown is shroud 322 and key structures 320. Shroud 322 protrudes from the bottom of pin chassis further than pins 120, thereby providing protection for pins 120 during manufacturing and subsequent handling as previously described.

Shroud 322 is positioned inside the outer perimeter of pin chassis 300, thereby forming shoulder 340 about the perimeter of chassis 300. Shoulder 340 is useful when mounting an assembled cartridge to a retention mechanism. A retention mechanism can provide a support upon which shoulder 340 rests, thereby preventing pins 120 from bottoming out in a socket.

Pin chassis 300 also provides a protective enclosure for a substrate assembly and any integrated circuits attached thereto prior to the attachment of a heat pipe lid on an assembled cartridge. For example, pin chassis 300 includes floor 303 and walls 309 that form cavity 342 within which the substrate assembly resides. Cavity walls 309 provide protection for the substrate assembly and other components. During assembly, prior to a heat pipe lid being attached, integrated circuit dice and other devices residing within the cavity are protected from damage. For example, multiple partially assembled cartridges may be inserted into carriers having slots. As a partially assembled cartridge is inserted into a slot, components attached to the substrate assembly are protected from the slots by virtue of being recessed within cavity 342.

Figure 3D:
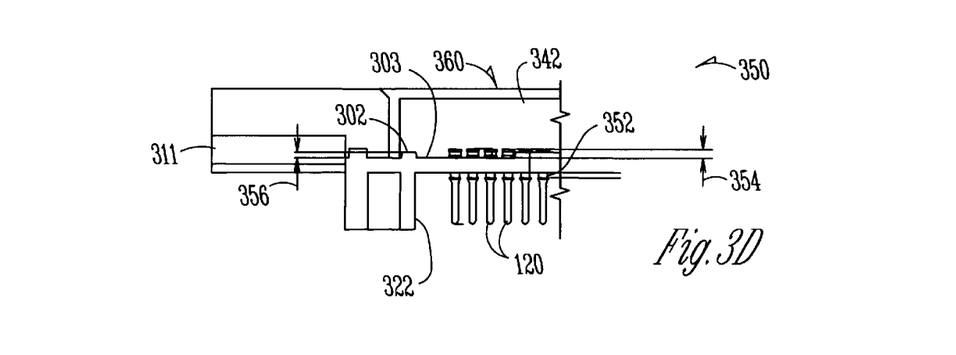
FIG. 3D is a detail view of a portion of FIG. 3C.

FIG. 3C also shows detail 350 which is exploded in FIG. 3D. As shown in FIG. 3D, pins 120 have detent features 352 that hold pins 120 within pin chassis 300. Pins 120 are pressed into pin chassis 300 in direction 360 until detent features 352 are exposed beneath the floor of chassis 300. Pins 120 are then held floatingly, such that they can move slightly in three dimensions. The ends of pins 120 protruding into the cavity are termed the "solder ends," and the ends below pin chassis 300 are termed the "mating ends."

Pins 120, after being inserted in chassis 300, have a pin height 354 above chassis floor 303. Support stands 302 also have a height 356 above chassis floor 303. The difference between pin height 354 and support stand height 356 can specify the amount of deflection of a substrate inserted within pin chassis 300. For example, in the embodiment of FIG. 3D, support stand height 356 is slightly smaller than pin height 354. In this embodiment, when a primary substrate is inserted in cavity 342 and soldered to pins 120, a small gap exists between support stands 302 and the primary substrate. If the primary substrate is pushed down above support stands 302, the primary substrate will deflect.

In some embodiments, support stand height 356 is substantially equal to pin height 354. In these embodiments, when a primary substrate is soldered to pins 120, there is a small gap between the primary substrate and support stands 302 caused by a nonzero solder thickness between pins 120 and the primary substrate. The primary substrate also deflects in these embodiments as a result of the small gap. In other embodiments, the nonzero solder thickness is taken into account, and support stand height 356 is substantially equal to the sum of pin height 354 and the nonzero solder thickness. In these embodiments, there is no gap between support stands 302 and the primary substrate, and as a result, the primary substrate does not deflect.

FIG. 3D also shows rail 311. Rail 311 is a feature that protrudes into recess 310 to provide a guide feature for a mating connector, and also serves to limit deflection on the primary substrate.

Heat Pipe Lid

Figure 4A:
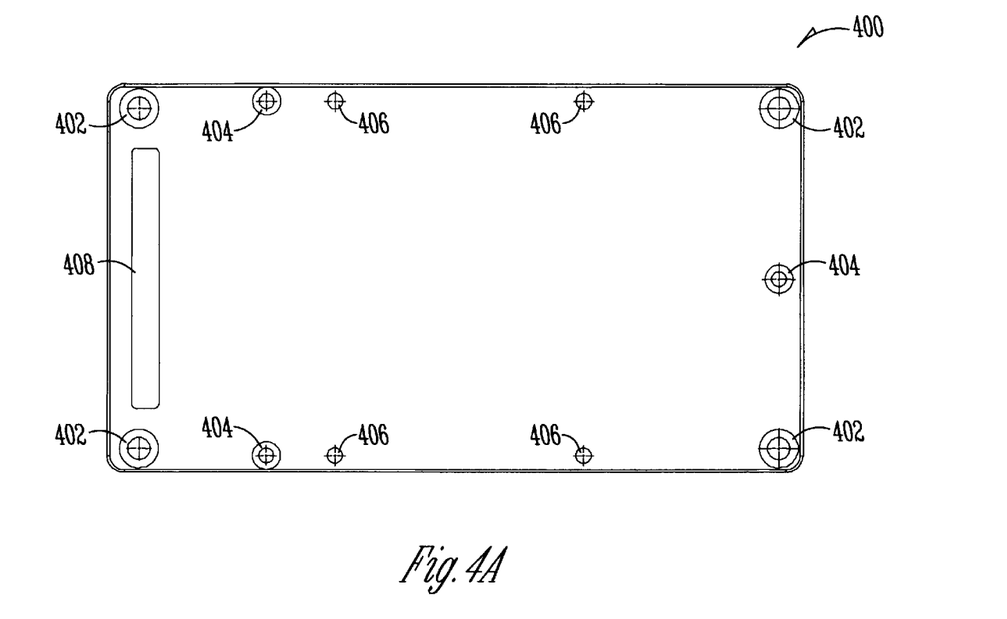
FIGS. 4A–4C show a top view, a cross-section, and a bottom view of a heat pipe lid.

FIG. 4A shows a top view of a heat pipe lid. Heat pipe lid 400 has a top surface that is substantially flat. The flat surface on top of heat pipe lid 400 can provide a standardized heat sink interface, regardless of the number and type of integrated circuit dice included within the assembled cartridge. A heat sink can be attached to heat pipe lid 400 using fastening points, such as fastening points 406. Also shown in FIG. 4A are fastening points 402 and 404. As previously described, fastening points 404 can be used to fasten heat pipe lid 400 to the rest of the cartridge, and fastening points 402 can be used to accept posts of a retention mechanism.

Heat pipe lid 400 also includes aperture 408. Aperture 408 resides above the edge connector on the substrate assembly, such as edge connector 108 on substrate assembly 104 (FIG. 1). When the edge connector is inserted in a mating connector, the mating connector is visible through aperture 408. Aperture 408 can be useful for checking that edge connector 108 is firmly seated, and can also be useful for the insertion of a tool to help mate and de-mate edge connector 108 with a mating connector.

Figure 4B:
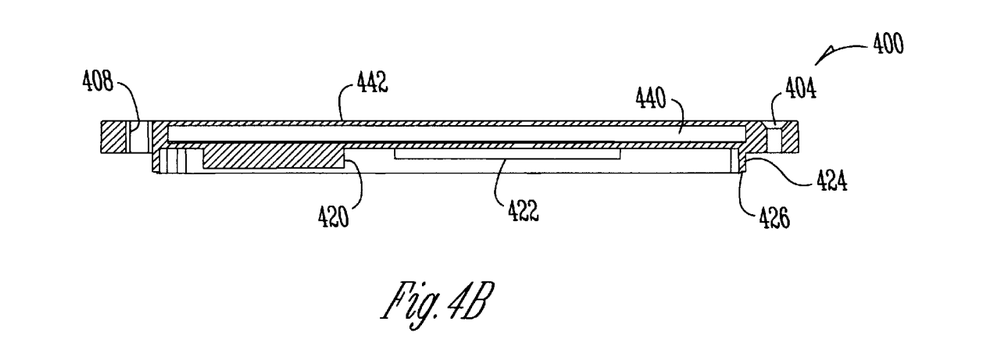

FIG. 4B shows a cross-section of a heat pipe lid. Heat pipe lid 400, as shown in FIG. 4B, has a top side and a bottom side. The top side is substantially flat as previously explained with reference to FIG. 4A. The bottom side has platens 420 and 422 protruding therefrom. Platens 420 and 422 make thermal contact with integrated circuit dice when heat pipe lid 400 is assembled in a cartridge. Heat pipe lid 400 includes vapor chamber 440 that has a working fluid and a wicking structure (not shown) to efficiently transfer heat from platens 420 and 422 to top side 442. Also shown in FIG. 4B is fastening point 404 and aperture 408.

Heat pipe lid 400 also includes rim 424. Rim 424 is sized such that when heat pipe lid 400 is mated to a pin chassis, rim 424 nests inside chassis wall 309 (FIG. 3A). Rim 424 includes feature 426. Feature 426 makes contact with an EMI control ring on the primary substrate, such as EMI control ring 210 on primary substrate 201 (FIG. 2A). Rim 424 extends from the bottom side of heat pipe lid 400 about the perimeter of the lid. Rim 424 protrudes into the cartridge cavity when assembled, and contacts the primary substrate Bond line thicknesses can be controlled by a combination of the rim height, the integrated circuit die height above the primary substrate, and the platen thickness.

In the embodiment of FIG. 4B, platen 420 protrudes further into the pin chassis cavity than does platen 422. This is useful in embodiments where platen 420 comes in thermal contact with integrated circuit dice that protrude less from the cavity floor than an integrated circuit die coming in thermal contact with platen 422. For example, the heat pipe lid embodiment of FIG. 4B is useful when mating with the substrate assembly embodiment of FIG. 2B, where integrated circuit dice 116 protrude further into the cavity than integrated circuit die 114 because integrated circuit dice are mounted on interposer 106.

Figure 4C:
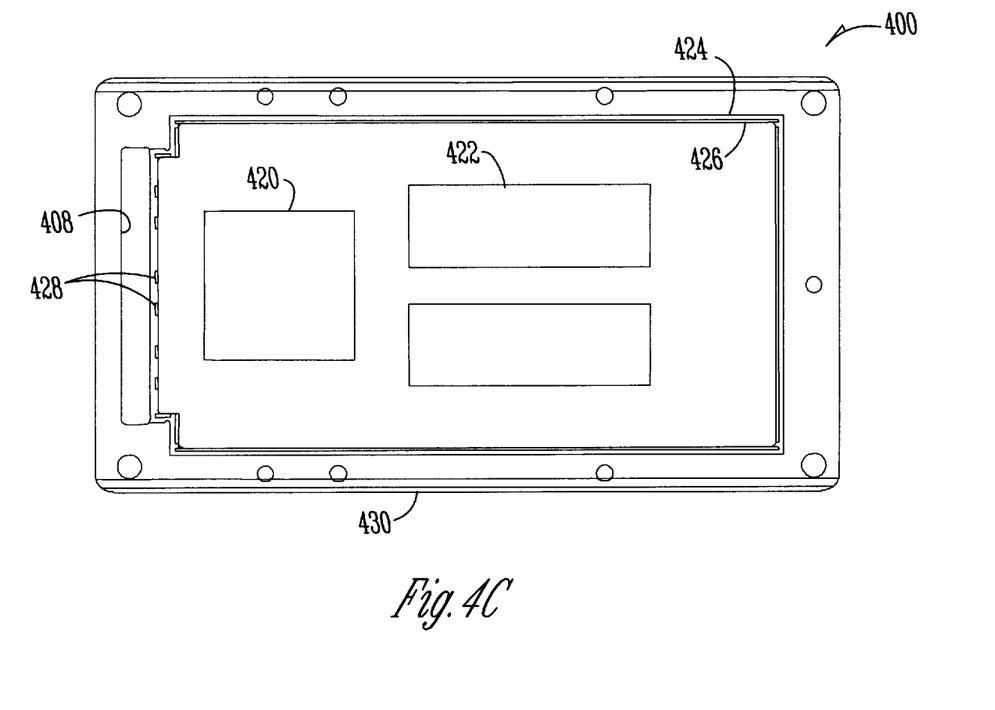

FIG. 4C shows a bottom view of a heat pipe lid. As shown in FIG. 4C, heat pipe lid 400 includes aperture 408, platens 420 and 422, rim 424 and feature 426. Also shown in FIG. 4C are feature segments 428. Feature segments 428 are small segments of feature 426 that make contact with stitch ring segments 212 (FIG. 2A). Also shown in FIG. 4C is lip 430. In some embodiments, lip 430 is a feature on at least one side of heat pipe lid 400. Lip 430 is described in greater detail with reference to FIG. 4D.

Figure 4D:
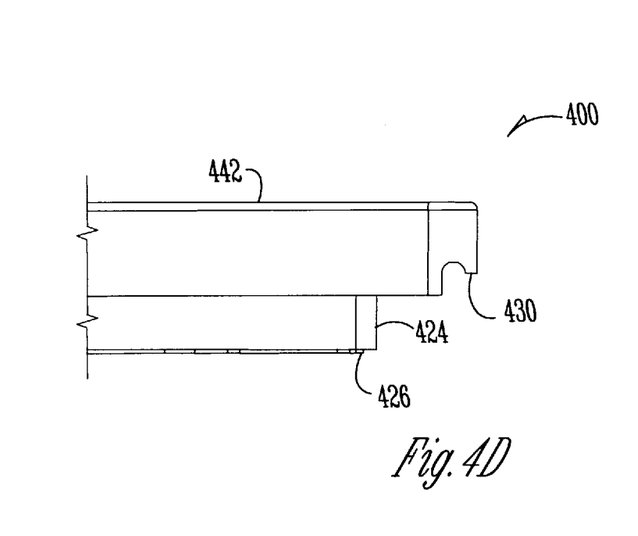
FIG. 4D shows a view of one end of a heat pipe lid.

FIG. 4D shows a partial end view of a heat pipe lid. Heat pipe lid 400 as shown in FIG. 4D includes top 442, rim 424, and feature 426. Also shown in FIG. 4D is lip 430. Lip 430 can be used for spring clips capable of holding a heat sink on top side 422 of heat pipe lid 400.

Assembled Cartridge

Figure 5A:
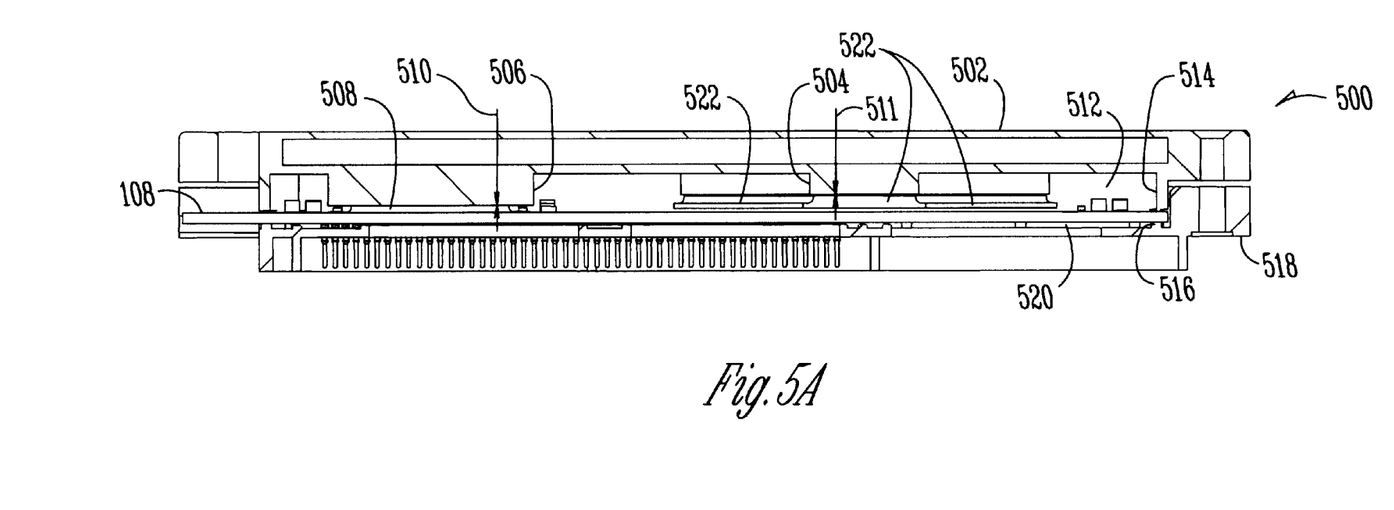
FIGS. 5A and 5B show cross-sections of an assembled cartridge according to one embodiment of the present invention.

FIG. 5A shows a cross-section of an assembled cartridge. Cartridge 500 is an assembly that includes a heat pipe lid, a substrate assembly, and a pin chassis. Heat pipe lid 502 includes platen 506 in thermal contact with integrated circuit die 508, and includes platen 504 in thermal contact with integrated circuit dice 522. The junction at which platen 506 joins integrated circuit die 508 defines a bondline having a bondline thickness 510. Bondline thickness 510 can be controlled as a function of platen size, the size of rim 514, and the height of integrated circuit die above primary substrate 520. One skilled in the art will understand that varying any of these parameters can change bondline thickness 510.

In the embodiments where different integrated circuit dice dissipate different amounts of heat, a bond line thickness can be maintained smaller for higher power devices, thereby allowing for more efficient heat transfer from a higher power devices. For example, if integrated circuit die 508 is known to dissipate more heat than integrated circuit dice 522, bondline thickness 510 can be maintained smaller than bond line thickness 511.

Also shown in FIG. 5A is support stand 516. The height of support stand 516 can also affect bondline thicknesses. In embodiments where support stand 516 is smaller than the sum of a pin height and a nonzero solder thickness as discussed with respect to FIG. 3D, primary substrate 520 will deflect, thereby affecting bond line thicknesses. Also shown in FIG. 5A is edge connector 108 sandwiched between the pin chassis and the heat pipe lid. Edge connector 108 is accessible to a mating connector.

During assembly, the substrate assembly is lowered into the pin chassis and soldered to the pins. A thermally conductive material is disposed on the integrated circuit dice, or the platens of the heat pipe lid, and the heat pipe lid is lowered into place. The various embodiments shown and described include differing numbers of integrated circuit dice mounted to the substrate assembly, and differing numbers of platens extending into the pin chassis cavity from the bottom of the heat pipe lid. In some embodiments, each platen contacts a single integrated circuit die, and in other embodiments, some platens contact multiple integrated circuit dice. Any number of platens and integrated circuit dice can be included without departing from the scope of the present invention.

In the embodiment shown in FIG. 5A, integrated circuit dice 522 includes five dice mounted within a separate package with a BGA footprint. The five integrated circuit dice 522 are mounted directly to primary substrate 520. In this embodiment, integrated circuit die 508 is also mounted directly to primary substrate 520. The relative placement of integrated circuit dice 508 and 522 can be seen more clearly in FIGS. 5B and 5C. In this embodiment, when integrated circuit dice 522 are memory devices, standard pre-packaged memory parts can be used.

Figure 5B:
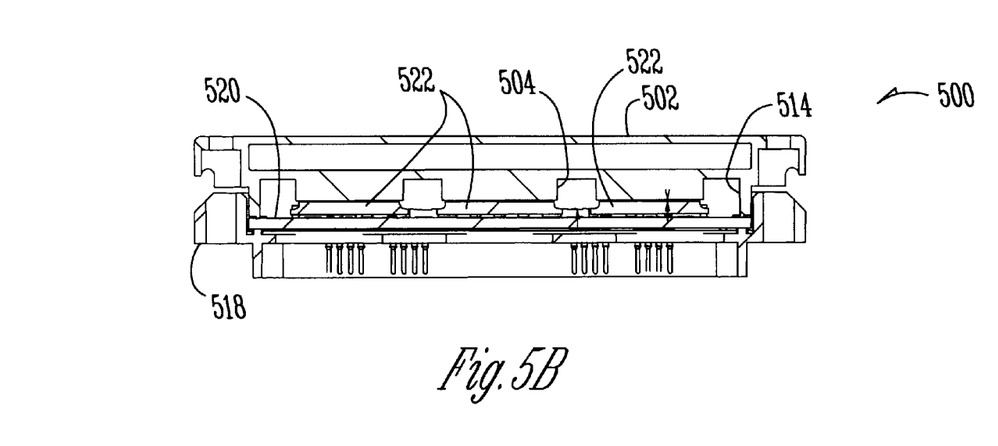

FIG. 5B shows a second cross-section of the assembled cartridge of FIG. 5A. In the embodiment of FIGS. 5A and 5B, interposers are not used, nor are secondary substrates. Integrated circuit die 508 is mounted directly to primary substrate 520, and integrated circuit die 522 is also mounted directly to primary substrate 520. Platens 506 and 504 extend differing amounts from the bottom side of heat pipe 502 to accommodate the relative heights of integrated circuit die 508 and integrated circuit dice 522.

Figure 5C:
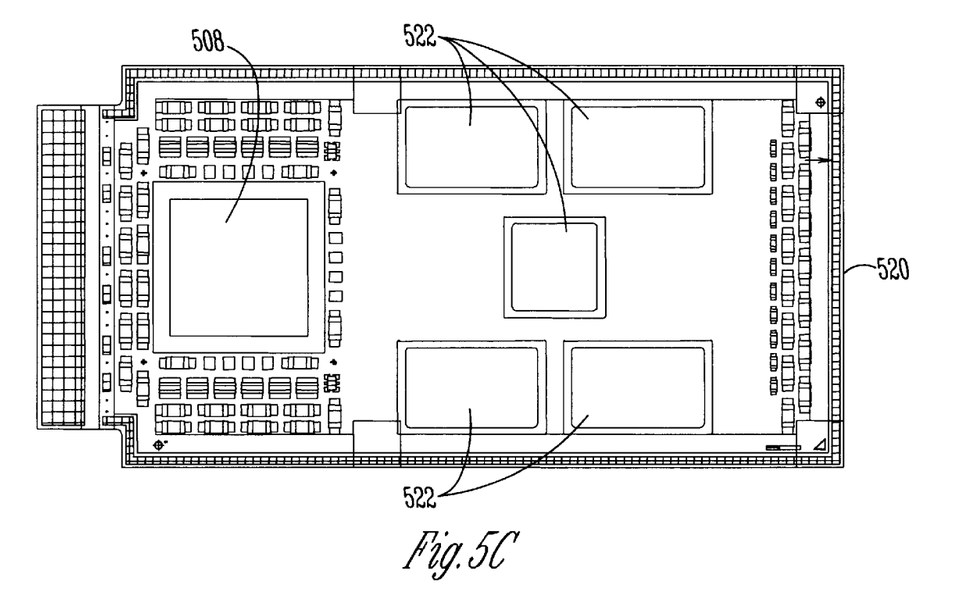
FIG. 5C shows a substrate assembly included in the assembled cartridge of FIGS. 5A and 5B.

FIG. 5C shows the primary substrate included within cartridge 500. Integrated circuit die 508 is flip-chip mounted directly to primary substrate 520. Integrated circuit dice 522 are pre-packaged BGA parts that are also mounted directly primary substrate 520.

Figure 6A:
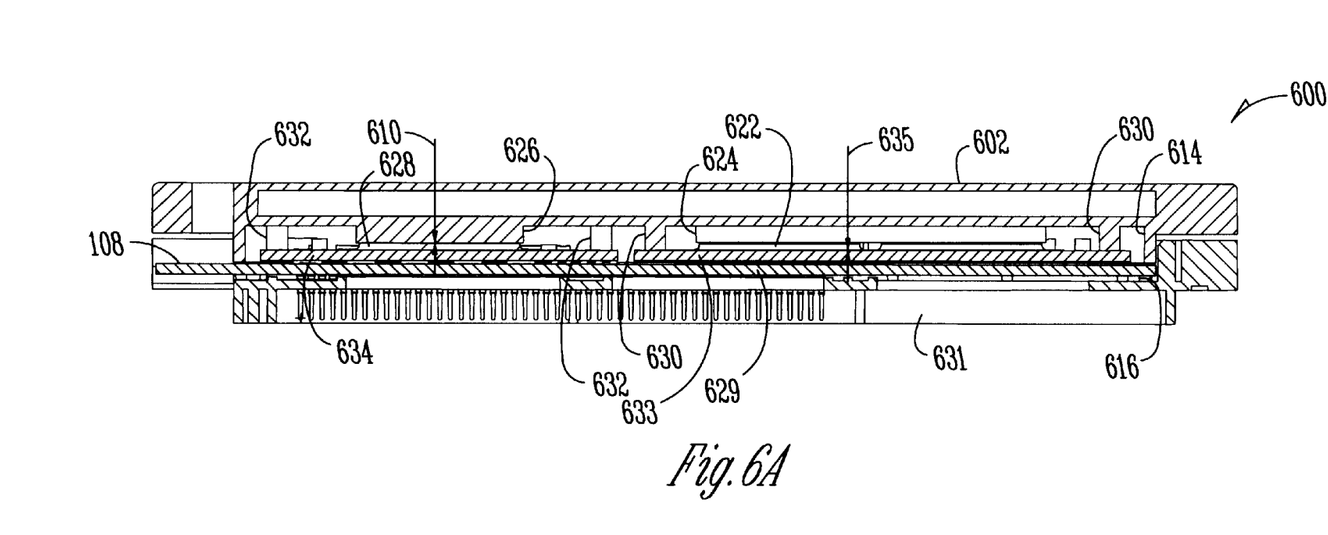
FIGS. 6A and 6B show cross-sections of an assembled cartridge according to another embodiment of the present invention.

FIG. 6A shows an assembled cartridge in accordance with another embodiment of the present invention. Assembled cartridge 600 includes heat pipe lid 602, a substrate assembly having edge connector 108, and pin chassis 631. The substrate assembly includes primary substrate 629 with interposer 633 and secondary substrate 634 mounted thereon. Interposer 633 includes integrated circuit dice 622 mounted thereon, and secondary substrate 634 includes integrated circuit dice 628 mounted thereon. Heat pipe lid 602 includes platen 626 in thermal contact with integrated circuit dice 628, and also includes platen 624 in thermal contact with integrated circuit dice 622. Bondline thicknesses in the embodiment of FIG. 6A are maintained through the use of rim 614 contacting primary substrate 629, as in the embodiment of FIG. 5A, and are also controlled by the use of standoffs 630 and 632.

Standoffs 630 protrude into the cavity from the bottom side of heat pipe lid 602 and make contact with interposer 633. One skilled in the art will understand that bondline thickness 635 can be maintained by varying the height of platen 624, the height of standoffs 630, and the height of integrated circuit die 622 above interposer 633. For example, for a given integrated circuit die height, bondline thickness 635 can be increased by decreasing the height of platen 624 or increasing the height of standoffs 630. Standoffs 632 functions similarly, in that bondline thickness 610 can be controlled by varying the height above standoffs 632, the height of platen 626, and the height of integrated circuit die 628 above secondary substrate 634.

Figure 6B:
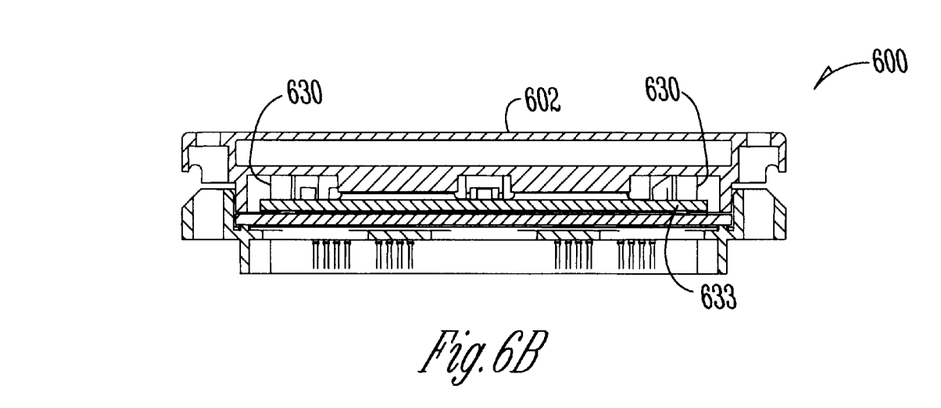

FIG. 6B shows a second cross-section of the assembled cartridge shown in FIG. 6A. In this embodiment, as shown in FIG. 6B, standoffs 630 extend into the cavity from heat pipe lid 602 and contact interposer 633.

The assembled cartridges of FIGS. 5A, 5B, 6A, and 6B have holes in each of the four corners, shown as fastening points 156 (FIG. 1). The holes are configured to receive posts from a retention mechanism. The posts can come through the holes in the cartridge to hold the cartridge in place and also can continue through a heat sink attached to the heat pipe lid, thereby securing the assembled cartridge and the attached heat sink. Shoulder 518 (FIG. 5A) of the pin chassis contacts the retention mechanism prior to the pins bottoming out in the socket.

Figure 7:
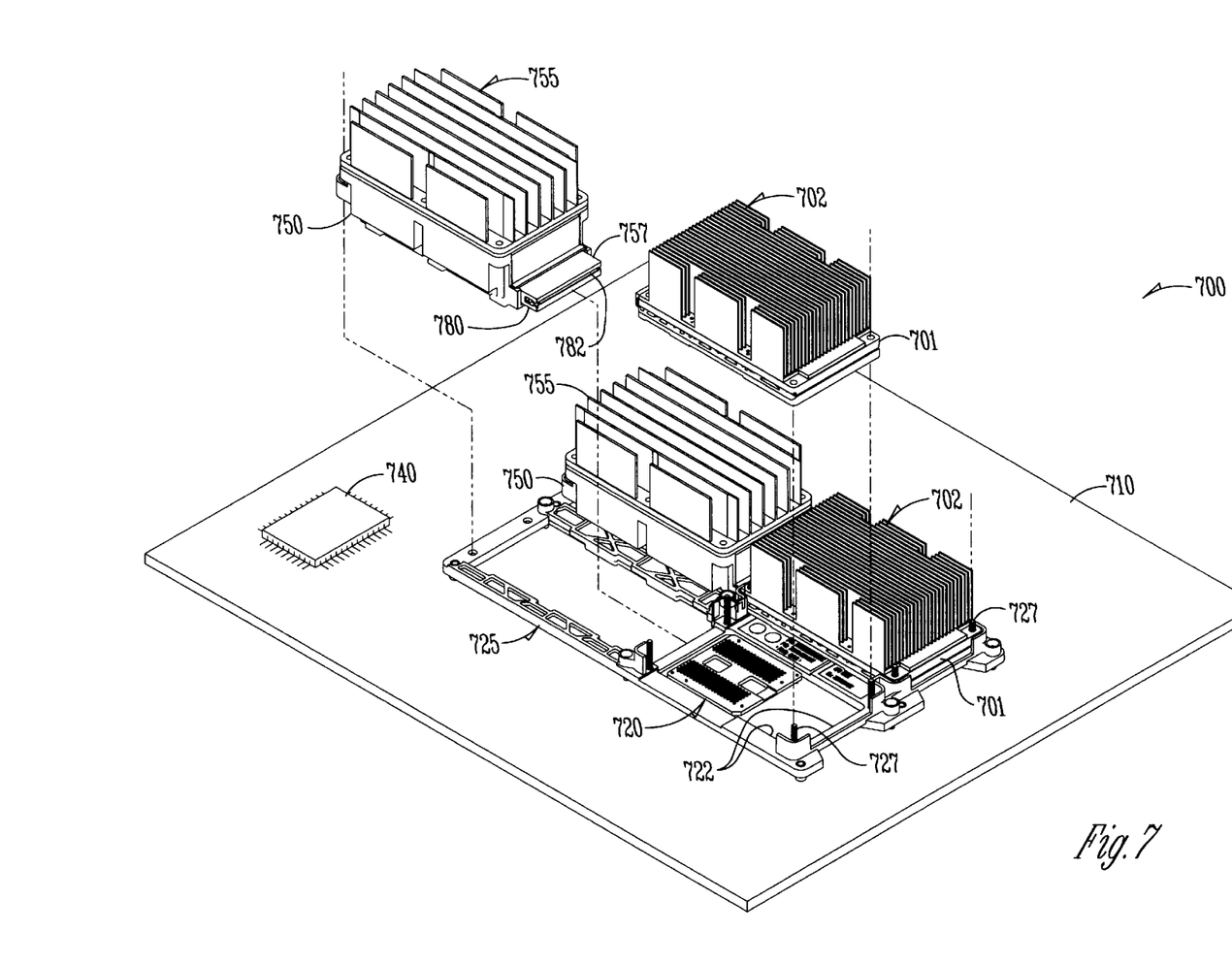
FIG. 7 shows a processing system.

FIG. 7 shows a processing system in accordance with an embodiment of the invention. Processing system 700 includes cartridges 701, socket 720, electronic component 740, and motherboard 710. Processing system 700 further includes retention mechanism 725 having posts 727. Retention mechanism 725 is mounted to motherboard 710, and receives cartridges 701. Cartridges 701 are shown having heat sinks 702 mounted thereon. In the embodiment shown in FIG. 7, heat sinks 702 do not extend to the corners of cartridges 701, thereby providing clearance for posts 727. In some embodiments, heat sinks 702 extend to the corners of cartridges 701, and have holes that accept posts 727.

Cartridges 701 mate with power pods 750. Power pods 750 provide power to cartridges 701. Power pods 750 have mating connectors 757 that receive the edge connector on the primary substrate in slot 782. Mating connectors have notches 780 to receive rail 311 (FIG. 3A) of the pin chassis. Power pods 750 have heat sinks 755. When processing system 700 is assembled, cartridges 701 are mated with power pods 750 prior to the cartridge/power pod combination being mounted to retention mechanism 725. Retention mechanism 725 includes lip 722 that shoulder 518 (FIG. 5A) can rest on. When shoulder 518 rests on lip 722, cartridge 701 stops traveling towards motherboard 710, and pins 120 (FIG. 1) are inserted a safe distance into socket 720. Within retention mechanism 725, socket 720 is mounted to motherboard 710.

In the embodiment of FIG. 7, retention mechanism 725 holds two cartridges. In some embodiments retention mechanism 725 holds one cartridge, and in other embodiments, retention mechanism 725 holds more than two cartridges. In some embodiments, multiple retention mechanisms are mounted to a single motherboard. Multiple retention mechanisms can be mounted to a single side of a motherboard, or can be mounted to opposing sides of a motherboard. For example, retention mechanism 725 is shown mounted on the top of motherboard 710. In some embodiments, another retention mechanism is mounted on the underside of motherboard 710 beneath retention mechanism 725.

Cartridges 701 can be any cartridge embodiment described herein, such as cartridge 100 (FIG. 1), cartridge 500 (FIG. 5), or cartridge 600 (FIG. 6). Cartridges 701 include a heat pipe lid, a substrate assembly, and a pin chassis such as those explained with reference to the prior figures. Socket 720 is a socket that receives pins 120 on a pin chassis. Socket 720 also includes keyway structures that mirror key structures on the pin chassis, such as key structures 320 on pin chassis 300 (FIG. 3B). Key structures on the pin chassis mate with keyway structures on socket 720 prior to pins included within cartridge 701 making contact with pin receptacles in socket 720.

Socket 720 is coupled to motherboard 710, thereby providing an electrical connection between motherboard 710 and cartridge 701. Likewise, electronic component 740 is also coupled to motherboard 710. Electronic component 740 is any component that can communicate with integrated circuit dice within cartridges 701. For example, electronic component can be a memory device, memory controller, bus controller, or the like. Processing system 700 provides communications between cartridge 701 and electronic component 740 while providing an efficient heat dissipation solution for integrated circuits housed within cartridge 701. The result is a readily manufacturable processing system capable of operating at increased speeds with increased reliability.

The assembled cartridge is an integrated circuit packaging solution that houses, efficiently delivers power to, and efficiently dissipates heat from, high power integrated circuit devices. Power is efficiently delivered to the integrated circuit dice through the edge connector rather than through pins, and heat is efficiently removed from the cartridge through the heat pipe lid. Further, horizontal mounting of the assembled cartridge exploits the grid area of pins to increase system bus performance by reducing the interconnect length from the motherboard to the integrated circuit dice.

The method and apparatus of the present invention also provide for a very fast signaling environment for integrated circuit dice. High power integrated circuit dice can be housed within cartridges and can be placed close to a motherboard, such that signal interconnects are kept short. Multiple integrated circuit dice, such as memory devices, can be mounted on an MCM having a BGA footprint, which is then mounted on the primary substrate, close to other integrated circuit dice and the motherboard. Close proximity of the MCM interposer to the additional integrated circuit dice promotes high performance electrical signaling within the cartridge.

In addition, multiple cartridges can be included in close proximity on a motherboard, thereby providing high speed signal interconnects between the multiple cartridges. Further, in some embodiments, cartridges are placed on opposing sides of the motherboard such that very fast signal interconnects can exist between cartridges on opposing sides of the motherboard. In embodiments that include processors in cartridges, a very fast system bus results. Multiple processors can communicate with each other and with memory systems very fast because of the fast signaling environment.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A cartridge comprising:
    a pin chassis having a bottom side and a top side, the bottom side having a plurality of pins protruding therefrom, the top side having a cavity therein; and
    at least one assembly including an integrated circuit die, the at least one assembly being disposed within the cavity and being electrically coupled to the plurality of pins;
    wherein the plurality of pins protrudes from the pin chassis a first distance, and the pin chassis further includes a shroud protruding from the bottom side, the shroud protruding further than the first distance, and wherein the pin chassis has an outer perimeter, and the shroud is positioned away from the outer perimeter such that a shoulder exists on the bottom side between the shroud and the outer perimeter.

2. The cartridge of claim 1 wherein the shroud includes key structures that mate with key structures of a socket.

3. The cartridge of claim 1 wherein the pin chassis includes a plurality of support stands within the cavity, the plurality of support stands contacting the at least one assembly.

4. The cartridge of claim 1 further including a heat pipe lid substantially covering the cavity, the heat pipe lid being in thermal contact with the at least one integrated circuit die.

5. The cartridge of claim 4 wherein the heat pipe lid includes at least one platen in thermal contact with the at least one integrated circuit die.

6. A cartridge comprising:
    a pin chassis having a bottom side and a top side, the bottom side having a plurality of pins protruding therefrom, the top side having a cavity therein;
    at least one assembly including an integrated circuit die, the at least one assembly being disposed within the cavity and being electrically coupled to the plurality of pins; and
    a heat pipe lid substantially covering the cavity wherein the heat pipe lid includes:
        a first platen that protrudes into the cavity a first amount and thermally contacts a first integrated circuit die to form a first bond line; and
        a second platen that protrudes into the cavity a second amount and thermally contacts a second integrated circuit die to form a second bond line.

7. The cartridge of claim 6 wherein the heat pipe lid includes a plurality of standoffs extending into the cavity.

8. A cartridge comprising:
    a pin chassis having a bottom side and a top side, the bottom side having a plurality of pins protruding therefrom, the top side having a cavity therein;
    at least one assembly including an integrated circuit die, the at least one assembly being disposed within the cavity and being electrically coupled to the plurality of pins, wherein the at least one assembly includes a substrate with a conductive control ring; and
    a heat pipe lid substantially covering the cavity, the heat pipe lid being in thermal contact with the at least one integrated circuit die.

9. The cartridge of claim 8 wherein the heat pipe lid includes a rim that protrudes into the cavity and makes electrical contact with the control ring.

10. A cartridge comprising:
    a heat pipe lid;
    an assembly having at least one integrated circuit die thermally coupled to the heat pipe lid; and
    a pin chassis having a plurality of pins electrically coupled to the assembly;
    wherein the assembly includes a substrate having a conductive control ring, and the heat pipe lid has a rim in electrical contact with the conductive control ring.

11. A cartridge comprising:

a heat pipe lid;

an assembly having at least one integrated circuit die thermally coupled to the heat pipe lid; and a pin chassis having a plurality of pins electrically coupled to the assembly;

wherein the pin chassis has a bottom side and a top side, and the plurality of pins protrudes from the bottom side, the top side having a cavity therein, the assembly is disposed within the cavity, and the heat pipe lid has a rim that protrudes into the cavity and contacts the assembly.

12. The cartridge of claim 11 wherein the assembly includes a substrate having a conductive control ring, and the rim contacts the conductive control ring.

13. The cartridge of claim 11 wherein the heat pipe lid includes at least one platen, the at least one platen being thermally coupled to the at least one integrated circuit die.

14. The cartridge of claim 13 wherein the at least one platen and the at least one integrated circuit die join at a junction forming a bond line having a bond line thickness.

15. A cartridge comprising:

a heat pipe lid;

an assembly having at least one integrated circuit die thermally coupled to the heat pipe lid; and a pin chassis having a plurality of pins electrically coupled to the assembly;

wherein the heat pipe lid includes at least one platen, the at least one platen being thermally coupled to the at least one integrated circuit die, and wherein the assembly includes a substrate having a bottom side and a top side, the top side having the at least one integrated circuit die mounted thereon, the bottom side having a plurality of interconnect points electrically coupled to the plurality of pins.

16. The cartridge of claim 15 wherein the pin chassis includes a plurality of support stands disposed within the cavity, the plurality of support stands being in contact with the bottom side of the substrate.

17. A cartridge comprising:

a heat pipe lid;

an assembly having at least one integrated circuit die thermally coupled to the heat pipe lid; and a pin chassis having a plurality of pins electrically coupled to the assembly;

wherein the pin chassis has a bottom side and an outer perimeter, and has a shroud coupled to, and extending away from, the bottom side of the pin chassis a distance away from the outer perimeter.

18. The cartridge of claim 17 wherein the assembly includes an edge connector configured to receive power, wherein the power is received on interconnects having low inductance and low impedance.

19. The cartridge of claim 17 wherein the at least one integrated circuit die includes one integrated circuit die having a plurality of signal contacts arranged substantially in a grid, the one integrated circuit die having the plurality of signal contacts electrically coupled to a top side of the assembly.

20. The cartridge of claim 19 wherein the plurality of pins are coupled to a bottom side of the assembly below the one integrated circuit die such that signal connections from the plurality of pins to the plurality of signal contacts of the one integrated circuit are substantially vertical and parallel.

21. The cartridge of claim 17 wherein the plurality of pins are soldered to the assembly thereby holding them substantially rigid relative to the pin chassis.

22. A processing system comprising:

a motherboard configured to receive a plurality of circuits; and at least one integrated circuit cartridge coupled to the motherboard, wherein the integrated circuit cartridge comprises:

a pin chassis having a plurality of pins protruding from a bottom side thereof, and having a top side with a cavity therein;

an integrated circuit die disposed on an assembly in the cavity, the assembly including a substrate having a conductive control ring; and a heat pipe in thermal contact with the integrated circuit die, the heat pipe having a rim in electrical contact with the conductive control ring.

23. The processing system of claim 22 wherein the packaged integrated circuit further comprises a primary substrate upon which the integrated circuit die is mounted.

24. The processing system of claim 23 wherein the packaged integrated circuit further comprises a multi-chip module mounted to the primary substrate.

25. A cartridge comprising:

a pin chassis having a bottom side and a top side, the bottom side having a plurality of pins protruding therefrom, the top side having a cavity therein, the pin chassis including a plurality of support stands within the cavity; and at least one assembly including an integrated circuit die, the at least one assembly being disposed within the cavity and being electrically coupled to the plurality of pins, wherein the plurality of support stands contacts the at least one assembly;

wherein the plurality of pins have a mating end protruding from the bottom side, and have a solder end protruding into the cavity a first height, and the plurality of support stands protrude into the cavity a height substantially equal to the first height.

26. A cartridge comprising:

a pin chassis having a bottom side and a top side, the bottom side having a plurality of pins protruding therefrom, the top side having a cavity therein, the pin chassis including a plurality of support stands within the cavity; and at least one assembly including an integrated circuit die, the at least one assembly being disposed within the cavity and being electrically coupled to the plurality of pins, wherein the plurality of support stands contacts the at least one assembly;

wherein the plurality of pins have a solder end protruding into the cavity a first height, the solder end being configured to accept solder having a solder thickness when electrically coupled to the at least one assembly, and the support stands protrude into the cavity an amount substantially equal to the sum of the first height and the solder thickness.

* * * * *